United States Patent [19]
Teschner et al.

[11] Patent Number: 5,698,082
[45] Date of Patent: Dec. 16, 1997

[54] METHOD AND APPARATUS FOR COATING SUBSTRATES IN A VACUUM CHAMBER, WITH A SYSTEM FOR THE DETECTION AND SUPPRESSION OF UNDESIRABLE ARCING

[75] Inventors: Götz Teschner, Gelnhausen; Jürgen Bruch, Hammersbach, both of Germany

[73] Assignee: Balzers und Leybold, Hanau am Main, Germany

[21] Appl. No.: 746,437

[22] Filed: Nov. 8, 1996

Related U.S. Application Data

[63] Continuation-in-part of Ser. No. 283,788, Aug. 1, 1994, abandoned.

[30] Foreign Application Priority Data

Aug. 4, 1993 [DE] Germany .................. 43 26 100.0

[51] Int. Cl.⁶ .................................................. C23C 14/34
[52] U.S. Cl. ........................... 204/298.03; 204/192.13; 204/298.08; 204/298.26
[58] Field of Search ................. 204/192.12, 192.13, 204/192.22, 298.08, 298.03, 298.26

[56] References Cited

U.S. PATENT DOCUMENTS

| | | |
|---|---|---|
| 4,731,576 | 3/1988 | Legatti . |
| 5,126,032 | 6/1992 | Szczyrbowski et al. . |
| 5,169,509 | 12/1992 | Latz et al. . |
| 5,192,894 | 3/1993 | Teschner ................... 204/298.03 X |
| 5,240,584 | 8/1993 | Szczyrbowski et al. . |
| 5,241,152 | 8/1993 | Anderson et al. ........... 204/298.03 X |
| 5,281,321 | 1/1994 | Sturmer et al. ............. 204/298.26 X |
| 5,415,757 | 5/1995 | Szcyrbowski et al. ........... 204/298.08 |
| 5,427,669 | 6/1995 | Drummond ................ 204/298.03 X |

FOREIGN PATENT DOCUMENTS

| | | |
|---|---|---|
| 0544107 | 6/1993 | European Pat. Off. . |
| 0546293 | 6/1993 | European Pat. Off. . |
| 2226666 | 12/1973 | Germany . |
| 2550282 | 5/1977 | Germany . |
| 3925047 | 1/1991 | Germany . |
| 4033856 | 7/1991 | Germany . |
| 4104105 | 8/1992 | Germany . |
| 4134461 | 4/1993 | Germany . |
| 4138793 | 5/1993 | Germany . |
| 4200636 | 7/1993 | Germany . |
| 4204998 | 8/1993 | Germany . |
| 4204999 | 8/1993 | Germany . |

OTHER PUBLICATIONS

G. Jackson, "Electrical . . . discharge", Vacuum/vol. 21/No. 11, pp. 533–543.

*Primary Examiner*—Nam Nguyen
*Attorney, Agent, or Firm*—Felfe & Lynch

[57] ABSTRACT

In an apparatus for coating substrates, having sputtering cathodes (4, 5) disposed in a vacuum chamber (1), sputtering targets (6, 7), a medium-frequency generator (9) connected to the cathodes (4, 5), and a system (16) for detecting and suppressing undesired arcing, a cycle of the medium-frequency signal of the medium-frequency generator (9) is divided into a plurality of time segments, the electrical values of current and voltage for a predetermined time segment being determined so as to form a measured value signal and being entered into a ground-free meter island (16). The meter island (16) is tied as a remote station into a circular network (9, 16, 17, 18, 19, 11) whose master station is situated in the control unit (11) present in the generator (9). The blocking of the generator (9) when an arc occurs takes place through a line (19) connecting the meter island (16) to the generator (9). The parameters of the arc surveillance and the detection of measured values are preset through the network (17, 18, 19) by means of software.

8 Claims, 11 Drawing Sheets

METHOD AND APPARATUS FOR COATING SUBSTRATES IN A VACUUM CHAMBER, WITH A SYSTEM FOR THE DETECTION AND SUPPRESSION OF UNDESIRABLE ARCING

This application is a continuation-in-part of U.S. Ser. No. 08/283,788 filed Aug. 1, 1994, now abandoned.

BACKGROUND OF THE INVENTION

The invention relates to a method and an apparatus for coating substrates, especially with electrically nonconductive coatings in a reactive atmosphere, the apparatus having sputtering cathodes disposed in a vacuum chamber which has a gas inlet, sputtering targets consisting of the material to be sputtered, a medium-frequency generator connected to the cathodes by a double conductor, and a system for the detection and suppression of undesired arcing.

A method and an apparatus are described in U.S. Pat. No. 5,169,509 for the reactive coating of a substrate with an electrically insulating material, silicon dioxide ($SiO_2$), for example; it consists of an alternating-current source connected to cathodes enclosing magnets which are disposed in a coating chamber and cooperating with targets, two ungrounded outputs of the alternating-current source being connected each to a cathode bearing a target, both cathodes being placed side by side in a plasma space in the coating chamber, and having each approximately the same distance apart from the substrate opposite it. The effective value of the discharge voltage is measured by an effective voltage detector connected to the cathode by a conductor and applied through a conductor as direct current to a regulator which controls the flow of reactive gas from the tank into the distribution line such that the voltage measured agrees with a set voltage.

An apparatus for the reactive coating of a substrate is also described in U.S. Pat. No. 5,240,584 (related to U.S. Pat. No. 5,126,032) in which a cathode that comprises two parts electrically separated from one another and from the vacuum chamber and is configured as a magnetron cathode, wherein the base body of the target, with its yoke and magnet, is connected through a capacitor to the negative pole of a direct-current voltage source, and to the power supply through a choke and a resistor parallel thereto, and wherein the target is connected through another capacitor to the plus pole of the power supply and to the anode which in turn is connected to ground through a resistor; an inductance is inserted in series with the low-induction capacitor and with the choke, and the value of the resistor is typically between 2 KΩ and 10 KΩ. This patented apparatus is already so configured that it suppresses most of the arcing that occurs during a coating process and lowers the energy of the arcs, and it improves the reignition of the plasma after arc.

SUMMARY OF THE INVENTION

The present invention is addressed to the problem of creating a system for early arc detection and suppression for coating apparatus of special size and power, which will permit the operating personnel to adjust the apparatus such that only the arcs that are harmful for a particular coating process will be suppressed.

This problem is solved in accordance with the invention by the fact that a half cycle of the medium-frequency signal of the medium-frequency generator is divided into a plurality of time segments, and for a predetermined time segment the electrical values of current and voltage for the formation of a set-voltage signal are detected and put into a meter island. For this purpose the voltage is determined through a compensated symmetrical voltage divider that is connected between the two cathodes and the current is determined through a converter which is looped into the lead of one cathode. The meter island is tied as a remote station into a feedback network, the master station of which is located in a control unit present in the generator and configured as a programmable storage controller. Blocking of the generator takes place whenever an arc occurs, through a connecting line which connects the meter island to the generator. For this purpose the parameters of the arc surveillance and value determination are preset via the network by means of software, e.g., by a programmable storage controller.

The reactive sputtering processes used preferentially in the apparatus in question show a hysteresis-affected dependency of the discharge voltage on the reactive gas content. Due to the steep characteristic at the working point they have a tendency even at slight fluctuations of the process parameters to tilt into another state, but one which is not appropriate for the process. A stable management of the process requires, among other things, that the power fed by the medium-frequency generator into the cathodes be constant. Therefore it is necessary to measure voltage and current at the cathodes as primary signals and from them to determine the power value by multiplication. The peak present in the voltage is dependent on the ignition performance in the system, which is affected by the type and pressure of the gas. This area is not important to the actual sputtering process, but it does considerably influence the average and effective voltage. If these factors would be used as a measure of the discharge voltage, then fluctuations in the ignition performance, due to pressure instabilities for example, would falsely indicate a variation in the actual discharge voltage. The latter is determined by the signal area (discharge area) adjoining the ignition peak. The area that is characteristic of the discharge and thus for the process can exhibit different curves, depending on the process set-up, so that it is useful, depending on the process used, to take into account different portions of the signals to establish the actual level.

To be able to judge and document certain process states it is necessary to learn the characteristic signal curves, for example with a recorder. The signals, however, must be appropriately processed, since ordinary recorders are unable to image signals in the frequency range in question (40 kHz, for example).

On account of the cathode capacity itself as well as any condensers that may be connected directly to the cathode, the measured current contains a quadrature component that has to be compensated by appropriate measures.

In sputtering with a reactive gas, flashovers occur in various forms which are usually called sparks. Sparking occurs on targets between regions that are occupied by an insulating coating and regions which are metallically clean, as an equalization of charges in the form of small flashes of light. Furthermore, short-circuits of the cathodes and/or targets occur between one another and between the cathodes and/or targets and other parts of the sputtering apparatus. Flashovers can interfere with the sputtering process and damage the target surface. Most of these flashovers are of low energy and extinguish by themselves without further ado. However, higher-energy flashovers also occur, which persist and form arcs and, if they are not quickly extinguished, lead to severe damage preventing the continuation of the process. To be able to react appropriately to these different flashovers it is necessary to develop methods for their reliable recognition and permitting the quick extinction of arcs. FIG. 3 is a qualitative representation of the curve of a typical spark (5th cycle).

The dual cathode system supplied with medium frequency is, as a rule, closed without grounding for reasons of symmetry. The maximum voltage occurring between the two cathodes is on the order of 1 . . . 2 kV. The potential difference between cathode and ground is of the same order of magnitude. So it is necessary to find a suitable method for measuring the voltage between the cathodes and the current passing through them.

Since different methods and processes are used in an existing apparatus, the possibility must be provided for a very flexible control of the arc logic and of the measurement in order to provide for the various requirements.

Figure 1:
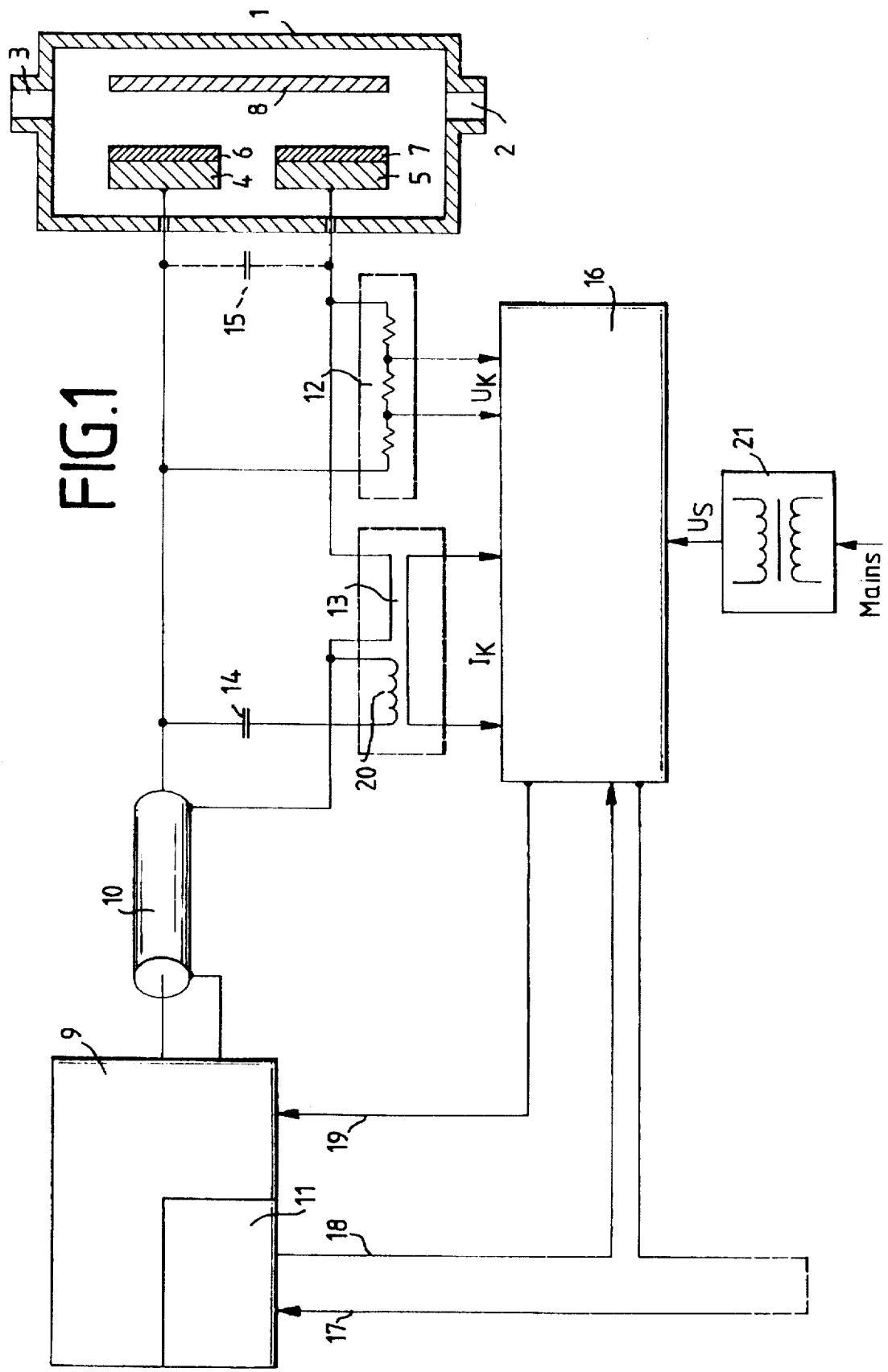
FIG. 1 the basic arrangement of the components of the apparatus.
Figure 2:
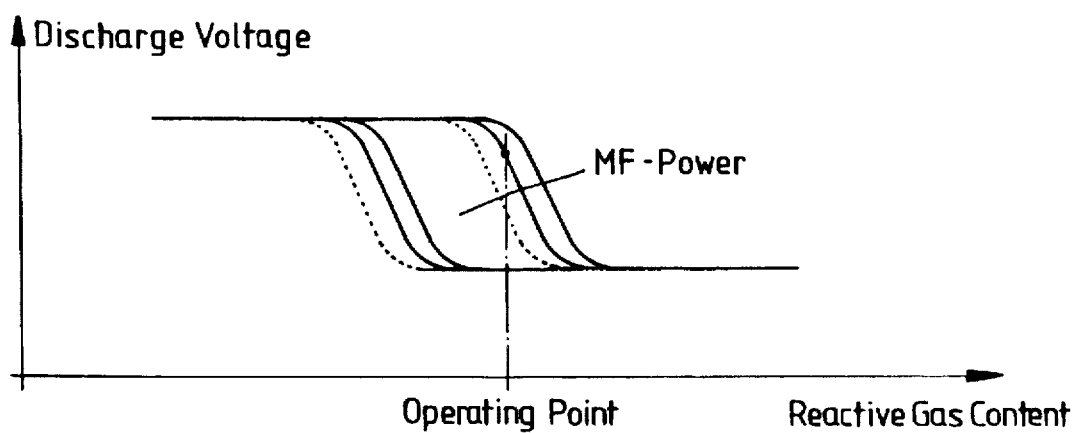
FIG. 2 a diagrammatic representation of the relationship between the reactive gas content and the medium-frequency power, FIG. 3 typical curves for the cathode voltage and cathode current, FIG. 4 a diagrammatic representation of cathode voltage and cathode current and the division into individual time segments, FIG. 5 a diagrammatic representation of arcing on one side (cathode against surroundings), wherein the arc counter is set at 3 and the arc counter reset is performed after two intact cycles.
Figure 3:
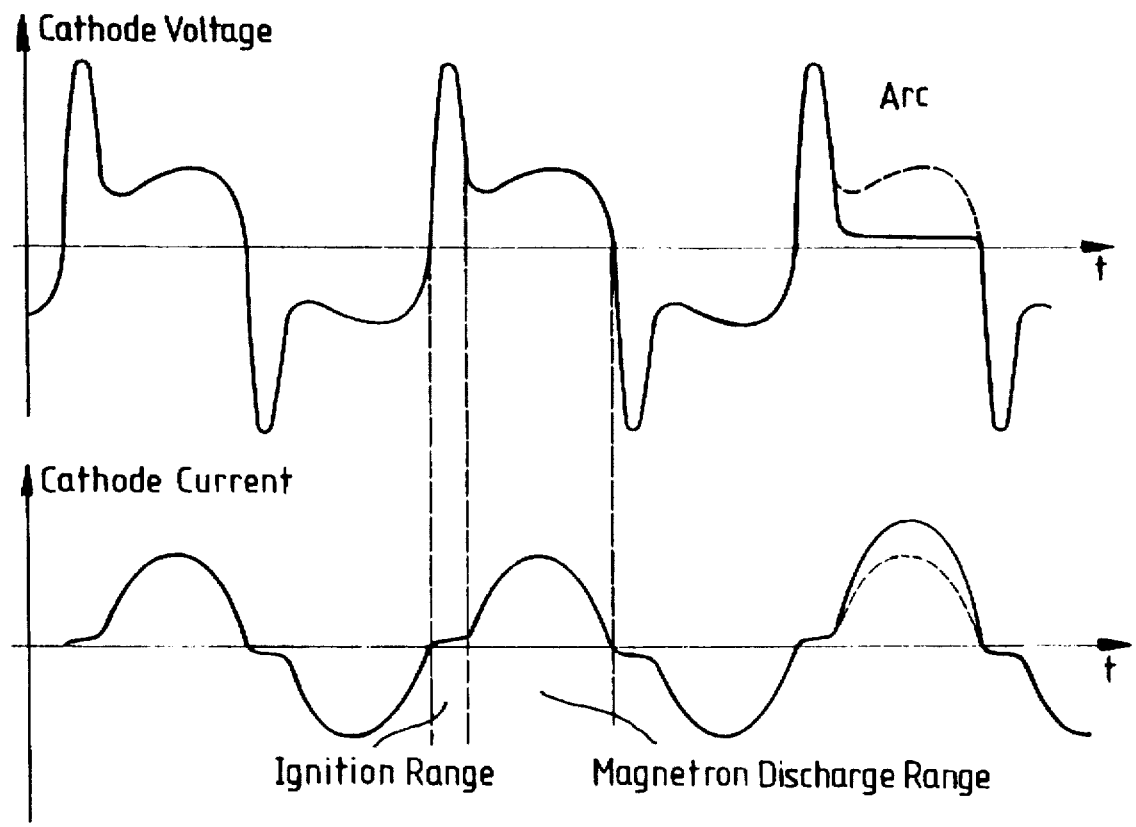

The apparatus consists essentially of the coating chamber 1 with the vacuum pump connection 2 and the gas inlet 3, and with the cathodes 4 and 5 disposed in the chamber with the corresponding targets 6 and 7, the substrate 8, the medium-frequency generator 9 connected by the coaxial cable 10 to the control 11, the voltage divider 12, the current converter 13 with compensation winding 20, the two capacitors 14 and 15, the medium-frequency arc logic signal detector 16 with isolation transformer 21 and the light pipes 17, 18 and 19 which connect the generator 9 and control 11 to the circuit 16. The circuit is in turn further represented in FIGS. 7 to 12, and consists essentially of the analog-to-digital converter 23, the component 24 for synchronization and timing, component 25 for the arc logic, the microprocessor 26 and the component 22 with analog inputs and trigger.

Figure 4:
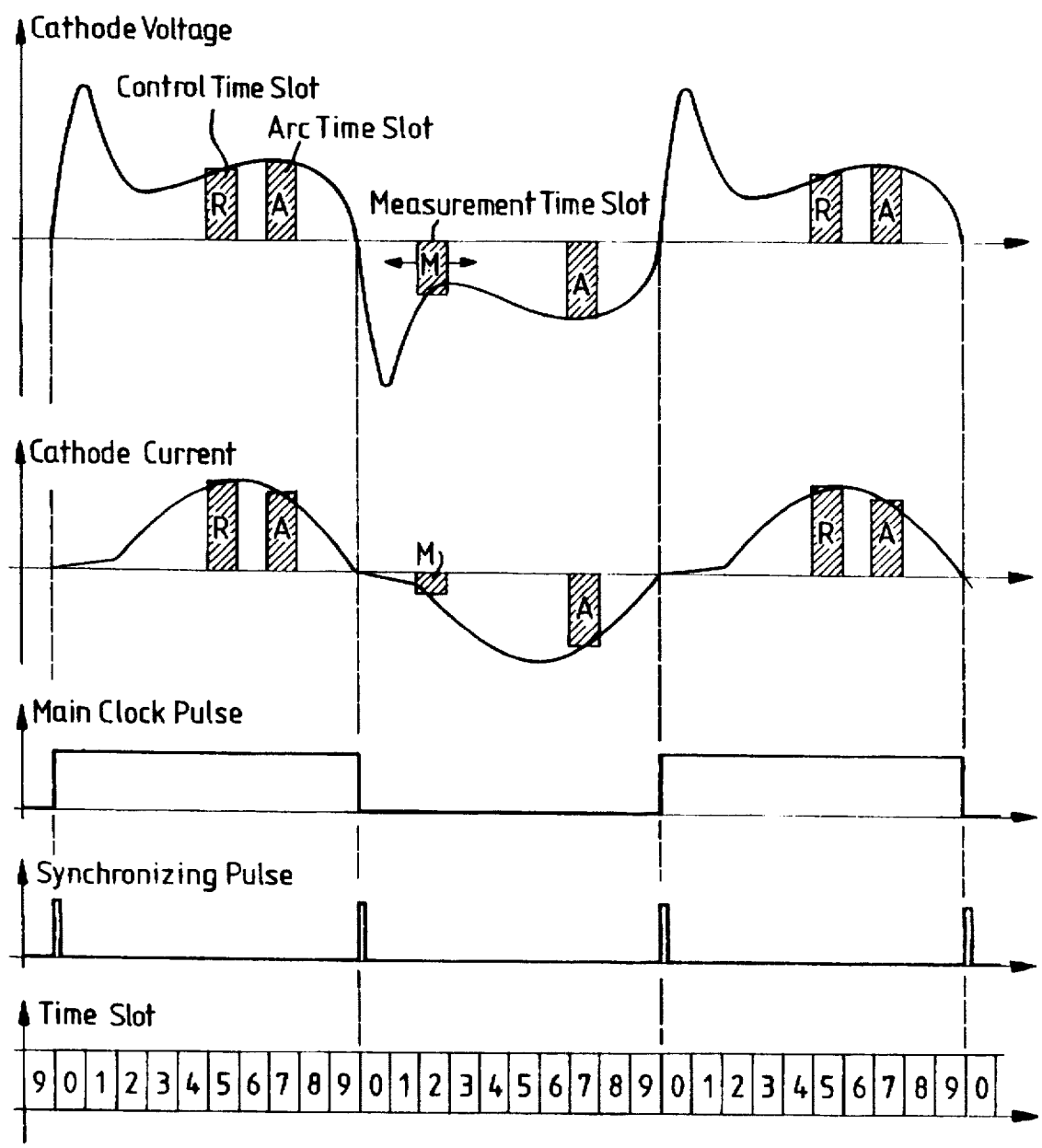

An important feature of the invention is that a cycle of the medium-frequency signal is divided into 10 time segments, for example, (see FIG. 4). By the appropriate selection of such a time segment and the detection of the currents and voltages present in this instant it is possible to employ the signal segment best suited for a controlling action, and only that segment, for the formation of the measured value signal. In FIG. 4 such a segment is identified by R. To monitor arcing, the signals are examined in another segment more appropriate for this purpose (marked A in FIG. 4). Furthermore, the signal levels in the individual segments can be scanned successively at a slow frequency (sampling method) and thus a low-frequency signal can be generated which has the characteristic curve of the medium-frequency signal (marked M in FIG. 4) and can be represented on a conventional recorder. The signals needed for the resolution of the cycle are synchronized by the nulls of the voltage signal.

Figure 5:
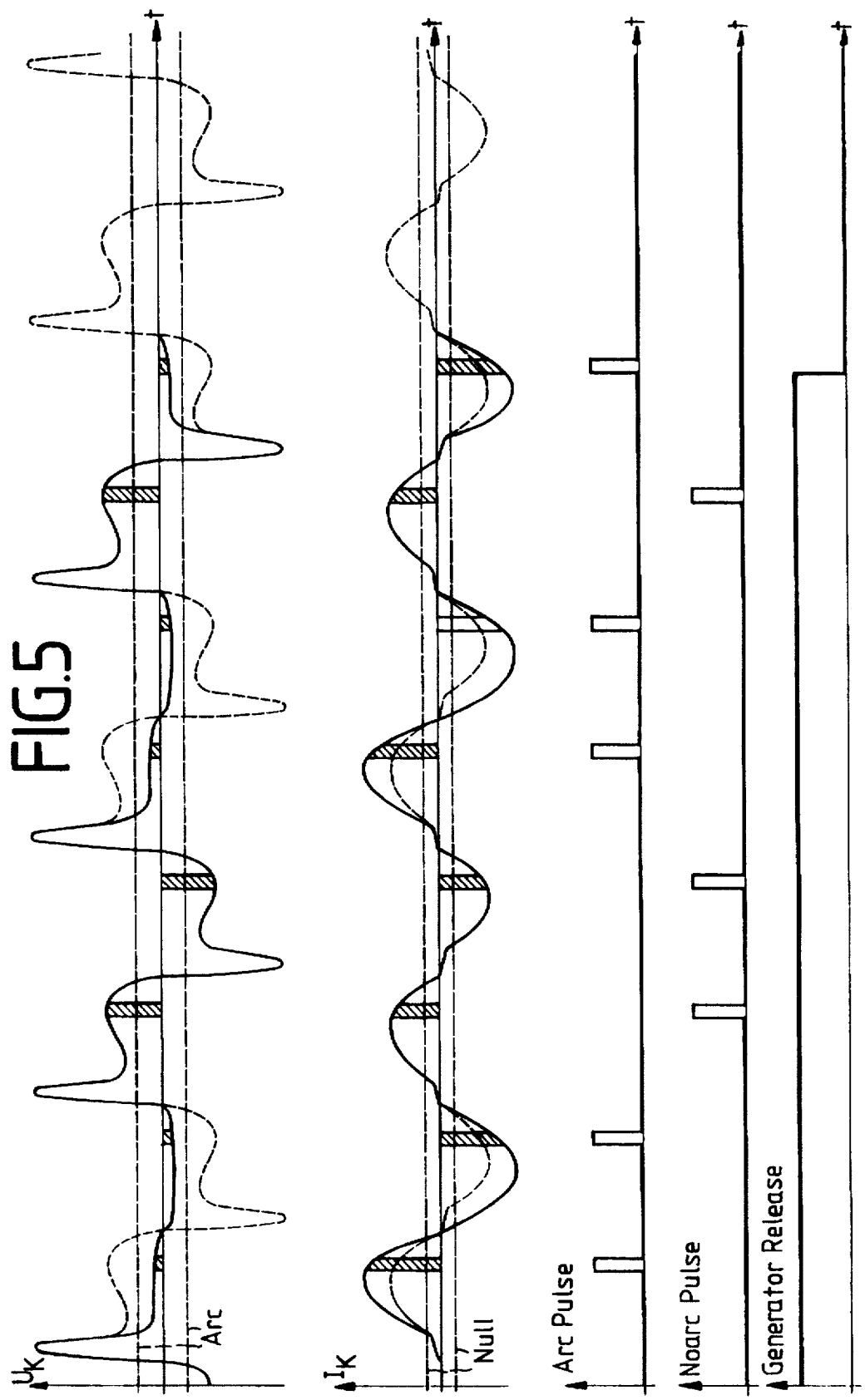
Figure 6:
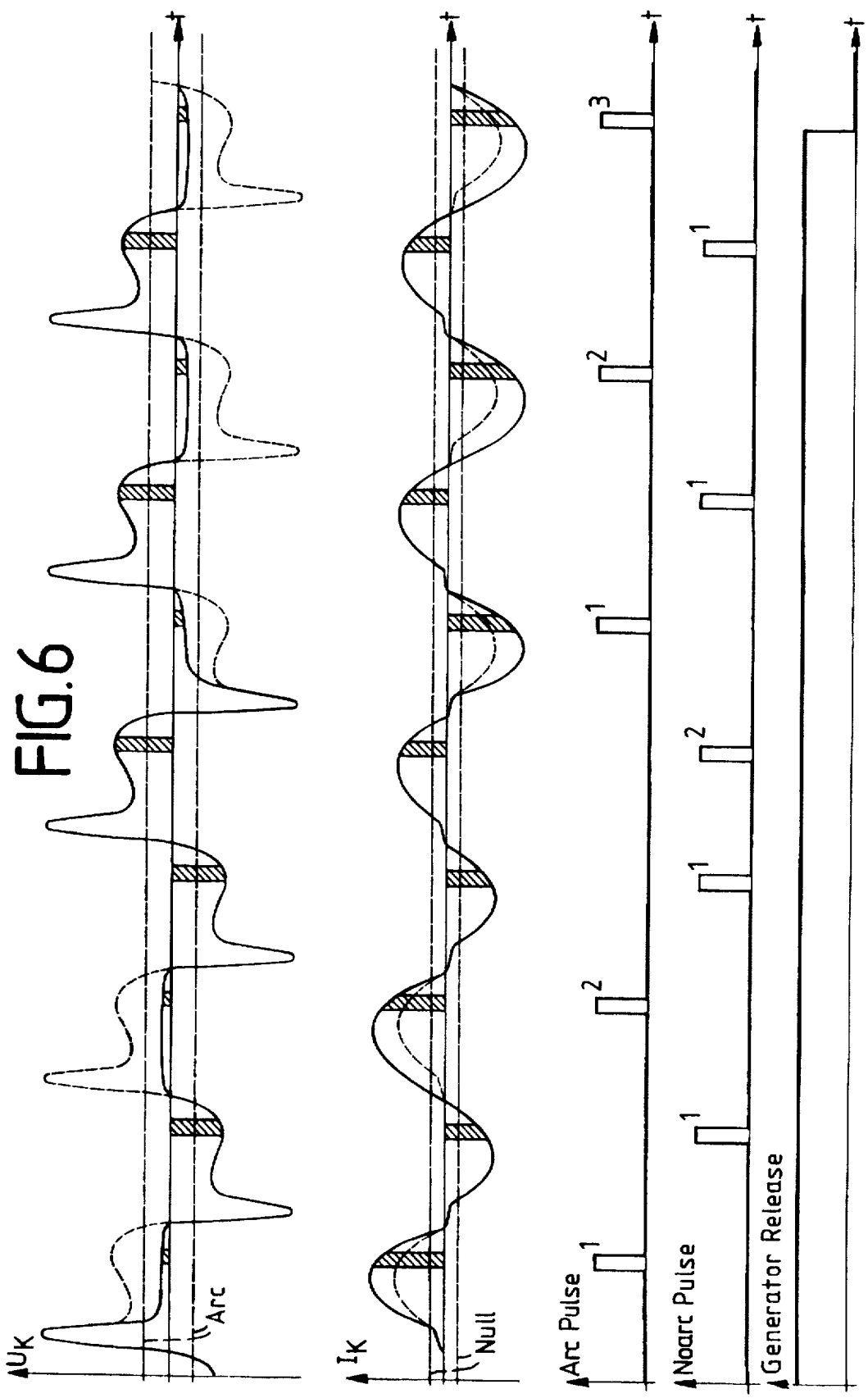
FIG. 6 a representation of symmetrical arcs (between two cathodes), wherein the arc counter is set at 3 and the arc counter reset is performed after two intact cycles, FIG. 7 a representation of the functional groups of the electronic MAM microprocessor (MAM=medium-frequency arc logic signal detector), FIG. 8 a representation of the analog inputs and of the trigger according to FIG. 7, FIG. 9 a representation of the components for synchronization and timing, FIG. 10 a representation of the component of the arc logic of FIG. 7, FIG. 11 a representation of the analog-to-digital converter of FIG. 7, and FIG. 12 a representation of the microprocessor of FIG. 7.

An arc is characterized by the fact that the voltage drops to a low level (the arc voltage), while at the same time the current remains at its high level or is still rising. Checking for such a state takes place in each cycle, in a section suitable for the purpose, as mentioned in the previous paragraph. If at the instant in question the voltage level is below a threshold $U_{arc}$ and the current level is higher than another threshold $I_{null}$, this is an arcing state. The arc signals are counted, this being done in as many as three separate event counters, one of which counts all of the arcs that occur, the next all that occur in the positive cycle, and the third all that occur in the negative cycle. In this manner the different symmetrical and unsymmetrical arcs can be evaluated separately. If these counters reach certain states preset by selector switches or by software from the PROM, a signal is produced which blocks the generator for a definite time which can be set by selector switch or by software. Then the arc monitoring is suppressed for a definite time which can be set by selector switch or by software, in order to prevent erroneous reactions due to re-entry oscillation when the power returns. By means of an additional counter, which is set back by every occurring arc, the number of successive intact cycles is counted, in which no arc state is detected. When this counter reaches a state preset by selector switch or by software the actual arc counter is reset, since it can be assumed that a previously occurring persistent arc has been extinguished. In FIGS. 5 and 6 a number of examples of arc monitoring are represented, and in this case only a single arc counter is assumed, which counts all the flashovers that occur.

The voltage is measured by a compensated symmetrical voltage divider 12 which is connected between the cathodes 4 and 5. The current is measured through a converter 13 which is looped into the feeder of a cathode. To compensate for the wattless currents through the converter directly at the capacitors 15 that are present, a compensating winding 20 is applied through which a capacitive compensation current can flow through the condenser 14 in the opposite direction through the converter.

The measurement is performed on an ungrounded meter island 16 which is housed in the immediate vicinity of the cathodes 4 and 5 and is at the center cathode potential. The signals are transferred from and to this island by light pipes. Power is supplied from an appropriately isolated transformer 21.

The meter island 16 is connected as a remote station to a feedback network 17 and 18 whose master station is located in the control 11 (e.g., PROM) present in the generator. The signal reading is controlled through this light pipe connection and the data are transferred from the meter island 16 to the control 11. The blocking of the generator in case of an arc is performed through a separate light pipe 19 connection permitting a fast reaction.

All the essential parameters of the arc surveillance and signal detection are supplied through the network by software, e.g., by a PROM.

The apparatus described uses only the relevant areas within the medium-frequency cycle for the control and stabilization of the process. This signifies a considerably more reliable operation of the process than in the case of the solutions known heretofore, which relate to the average and effective values of the signals. Detecting the signal levels directly at the cathodes prevents signal distortions, and the isolation problems they raise are solved by the use of light pipes. Due to controlling via a bidirectional network connection the signal detection system can be configured in an extremely flexible manner, since the arc surveillance and signal processing can be parametered by software. Arcing is securely recognized and rapidly quenched.

The example given is based on the scheme represented in FIG. 1. The medium-frequency generator 9 has a frequency of 40 kHz. The parts essential to the invention are the electronic-chip MAM 16, which is supplied through an isolation transformer 21 and to which the measured value signals of the cathode current and cathode voltage are fed through the current converter 13 and the voltage divider, a compensation circuit 14 and 20 and the light pipe connections 17, 18 and 19 which connect the electronic chip to the medium-frequency generator 9 and the PROM 11.

Figure 7:
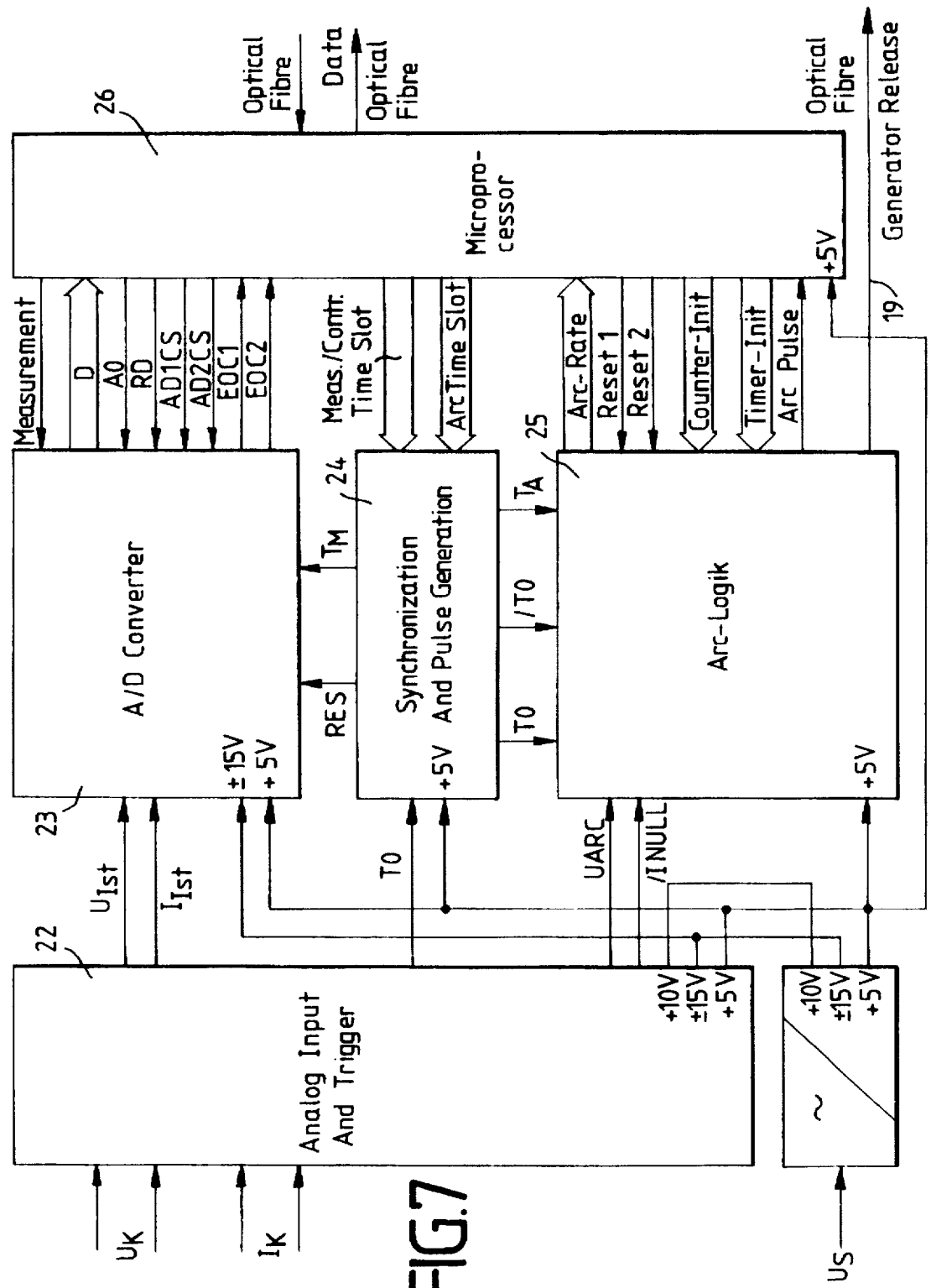

FIG. 7 gives an overall view of the different functional groups of the MAM electronic chip and meter island 16, wherein the $I_K$ and $U_K$ taken from the cathode power source flows into the input component 22, whose processed signals then flow through components 23, 24 and 25 to the microprocessor 26 and from there to the generator 9. In FIGS. 8 to 12 the individual circuit components are shown in greater detail, the direction of current flow being indicated by arrows.

| Unit | Circuit member type |
| --- | --- |
| 27. Differential input amplifier | (BUF03, HA2525) |
| 28. Input amplifier | (HA2525) |
| 29. Comparator | (LM319) |
| 30. Comparator | (LM319) |
| 31. Comparator | (LM319) |
| 32. Rectifier | (TL084) |
| 33. Rectifier | (TL084) |
| 34. Timer | (XO5860) |
| 35. Decimal counter | (74HCT4017) |
| 36. 4-bit BCD counter | (74HCT190) |
| 37. Digital comparator | (74HCT85) |
| 38. Digital comparator | (74HCT85) |
| 39. Programmable 4-bit down-counter | (74HCT190) |
| 40. Programmable 4-bit down-counter | (74HCT190) |
| 41. Programmable 4-bit down-counter | (74HCT190) |
| 42. Programmable 4-bit down-counter | (74HCT190) |
| 43. 1 kiloHerz square-wave generator | (74HCT04) |
| 44. 6-bit binary counter | (In 80C31) |
| 45. Timer 1 | (74HCT191) |
| 46. Timer 2 | (74HCT191) |
| 47. LWL Transmitter | (DC9003P) |
| 48. 12-bit A/D converter | (ADS7800) |
| 49. 12-bit A/D converter | (ADS7800) |
| 50. Input-Output Interface | (74HCT573, 74HCT574, 74HCT245) |
| 51. CPU (CENTRAL PROCESSING UNIT) | (80C31) |
| 52. EPROM (ERASABLE, PROGRAMMABLE READ-ONLY MEMORY) | (27C256) |

-continued

| Unit | Circuit member type |
| --- | --- |
| 53. RAM (RANDOM ACCESS MEMORY) | (HM6264) |
| 54. Chip-select logic | (74HCT138) |
| 55. Gate array | (AGMA-M32) |
| 56. Gate array | (AGMA-M32) |
| 57. Receiver | (DC90003P) |
| 58. Transmitter | (DC9003P) |

Figure 8:
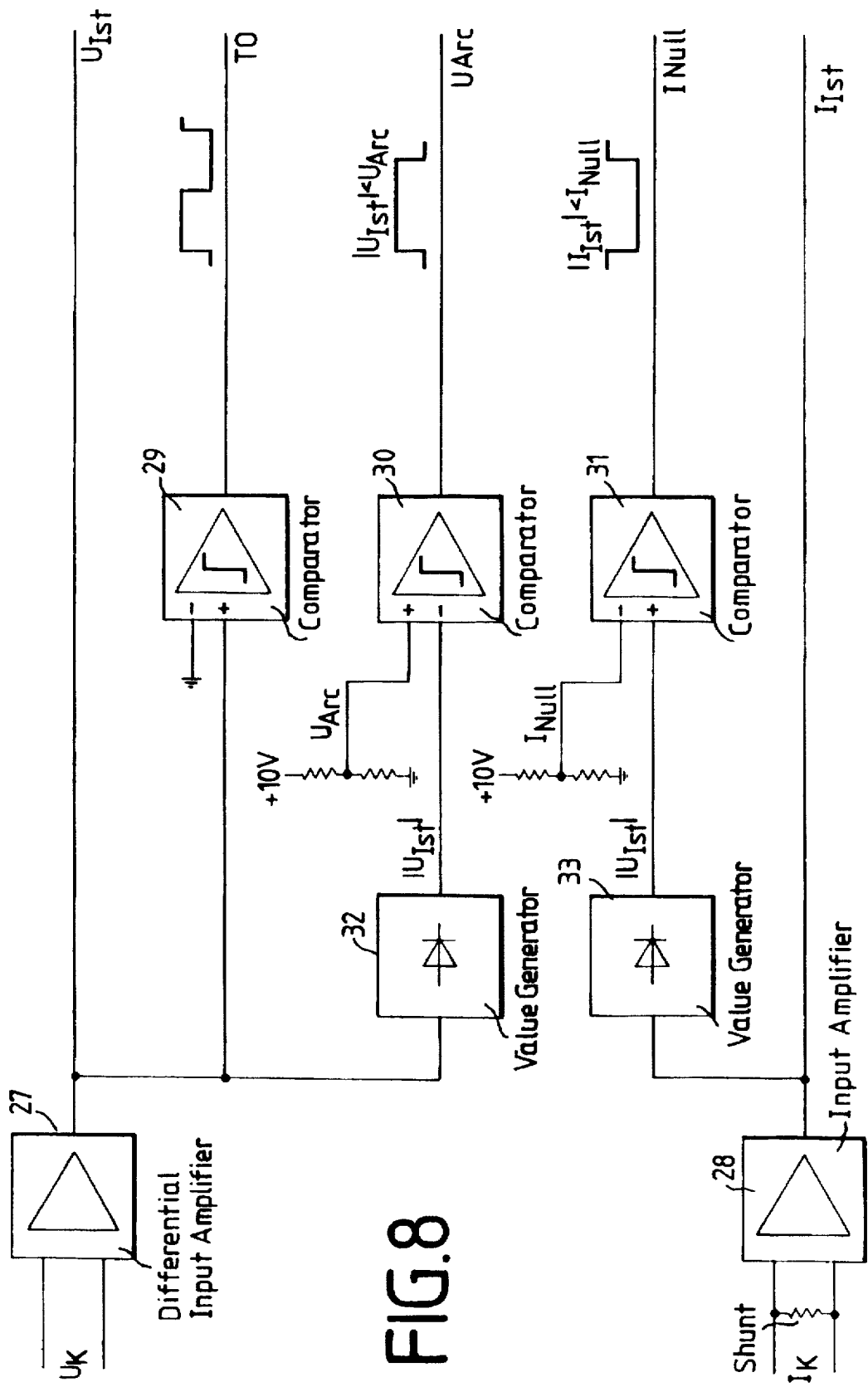
Figure 9:
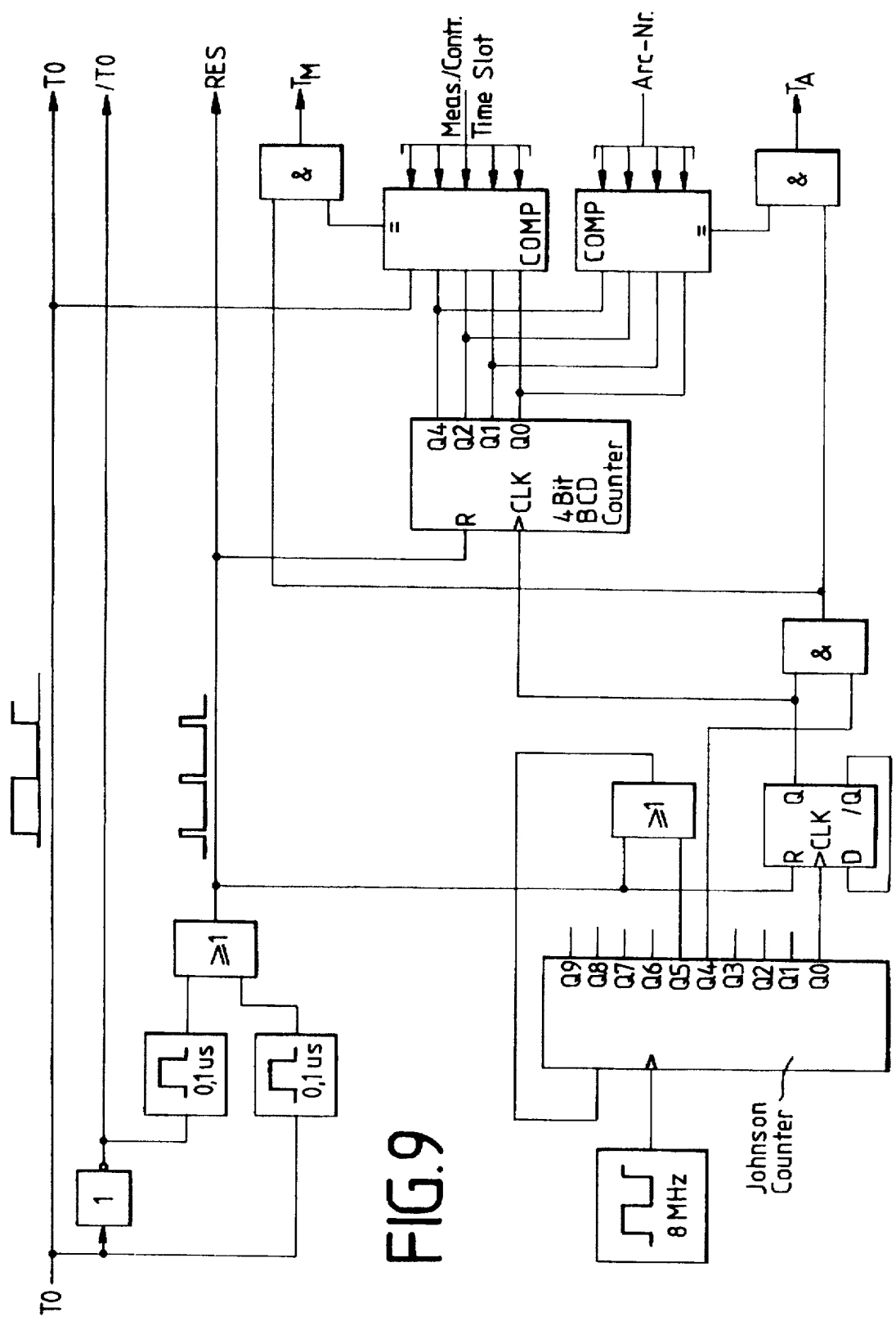
Figure 10:
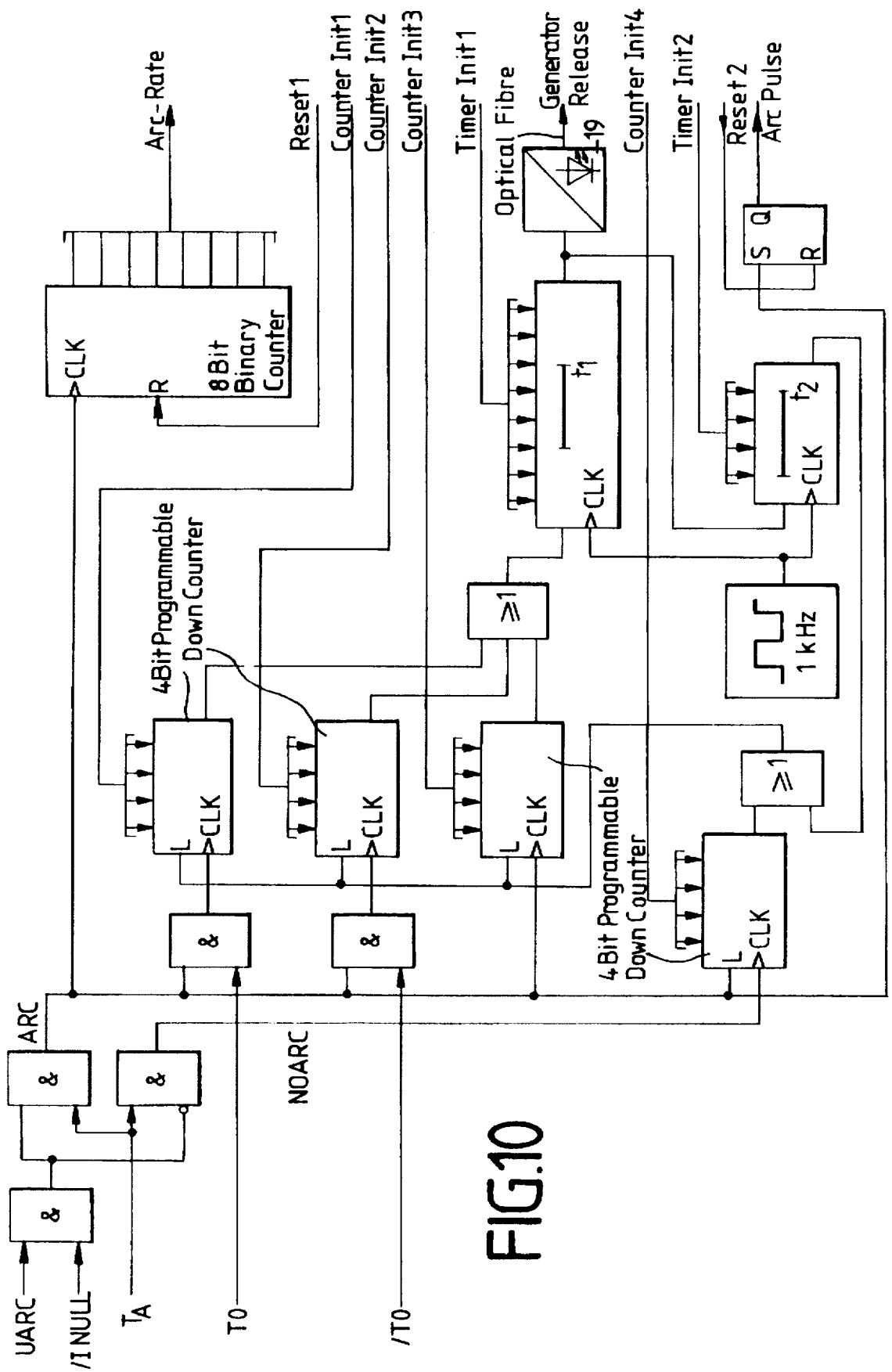

FIG. 8 is a detailed layout of the arc input and trigger component 22 depicted in FIG. 7. The actual measured values $U_K$ and $I_K$ are amplified by input amplifiers 27 and 28, the current value $I_K$ being transformed to a proportional voltage signal $U_{IST}$. The amplified values $U_{IST}$ and $U_{IST}$ are fed to respective rectifiers 32, 33, as well as to the A/D converter 23. The rectified output signals $|U_{IST}|$ and $|U_{IST}|$ are fed to respective comparators 30, 31, where they are compared to threshold values $U_{THRESH-UARC}$ and $U_{THRESH-INULL}$. The threshold values are adjusted by the values of the resistances in voltage dividers $VR_U$ and $VR_I$. The values $U_{THRESH-UARC}$ and $U_{THRESH-INULL}$ are chosen according to the specific discharge conditions, which depend on parameters of the sputtering process. To summarize, the threshold values are preset by choosing the appropriate resistances for the voltage dividers, according to the plasma process being used.

Figure 11:
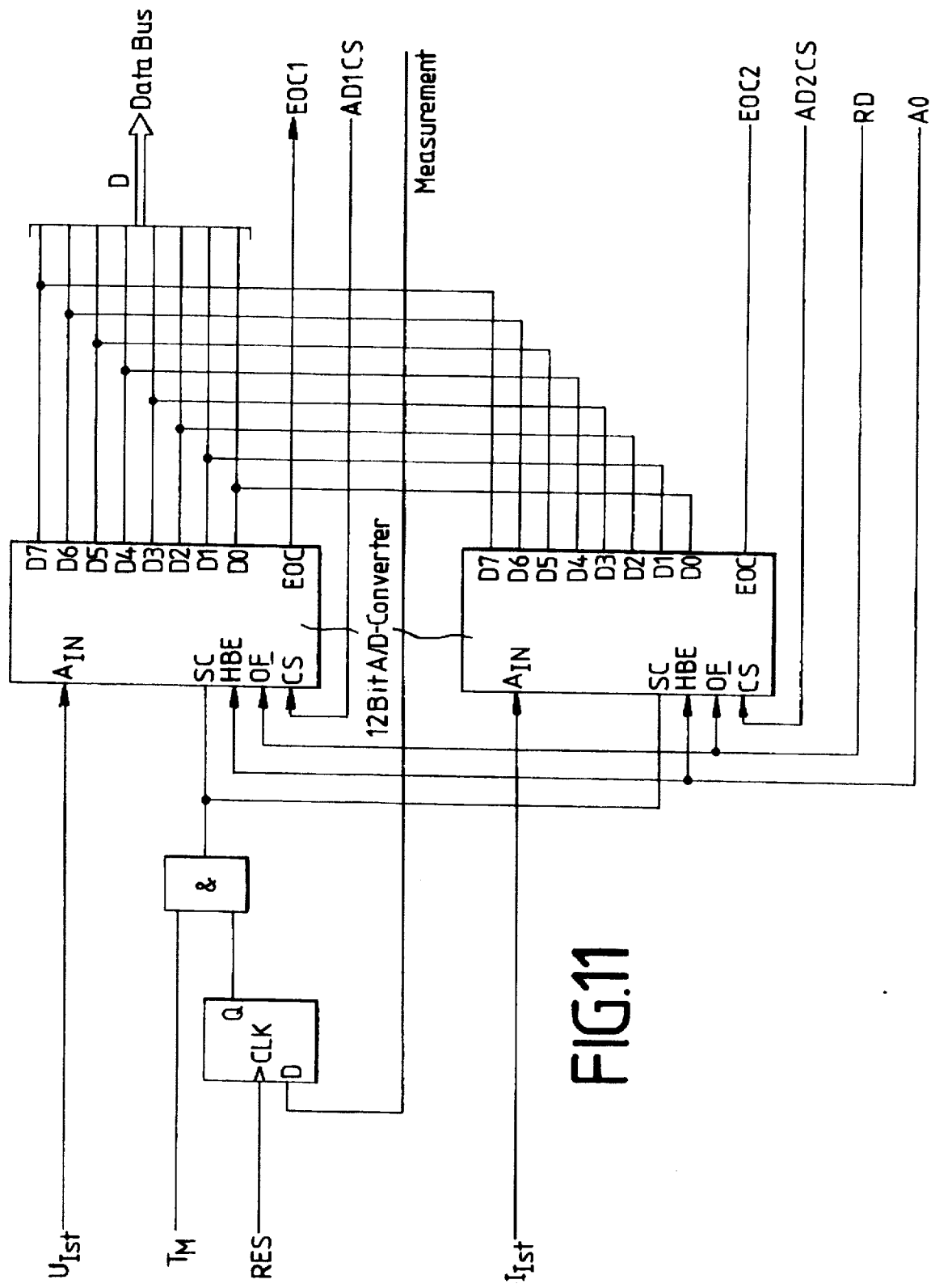
Figure 12:
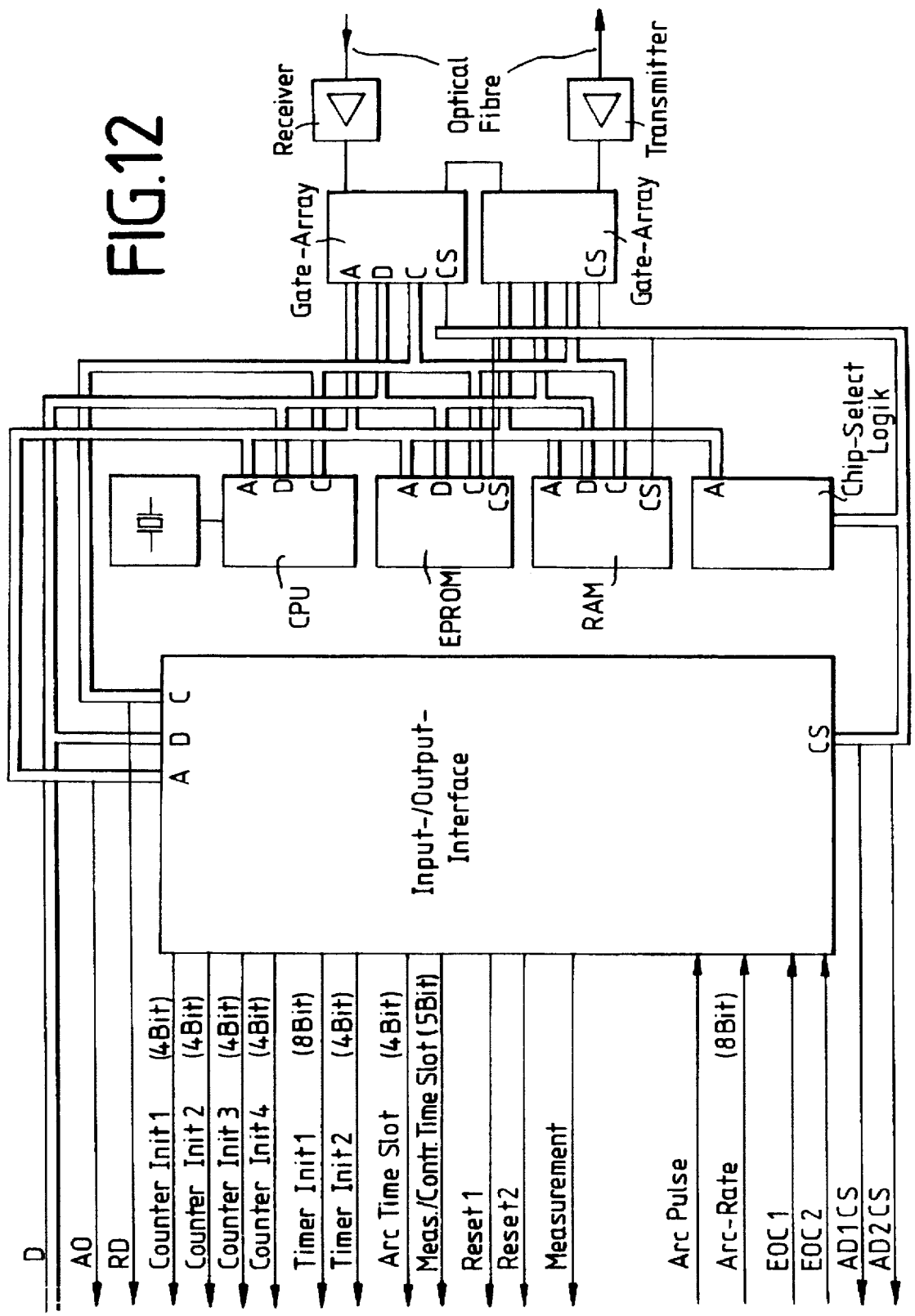

The function of the programmable storage controller 11 is to provide threshold values generally, such as preset counter limits and preset gate times for sampling the measured voltages in the periods R, M, and A of FIG. 4. These preset threshold values are transmitted to the meter island 16 by light pipe 18, but for the threshold values $U_{THRESH}$, which are determined internally in element 22. Measured data are transmitted from element 16 to element 11 via light pipe 17, this data representing (for example) the discharge conditions. The current and voltage values transformed by the A/D converters shown in FIG. 11 are not used as thresholds for arc detecting. These values are only used to monitor the discharge over the longer term.

What is claimed is:

1. Apparatus for coating substrates with an electrically non-conductive coating in a reactive atmosphere, said apparatus comprising a vacuum chamber having a process gas inlet, a pair of sputtering cathodes located in said vacuum chamber, said cathodes carrying targets consisting of a material to be sputtered, a medium frequency generator connected to said cathodes by a pair of conductors, said generator having a cycle separated by voltage nulls and divided into a plurality of time segments, said generator comprising a programmable storage controller which forms threshold values of voltage and current for detection of arcs, a compensated symmetrical voltage divider connected between said pair of conductors for determining a voltage value, a current converter looped into one of said conductors for determining a current value, an ungrounded meter island which samples said voltage and current values during predetermined said time segments and forms measured value signals based on said sampled voltage and current values, a feedback network for transmitting said measured value signals to said programmable storage controller, and for transmitting said threshold values back to said meter island, means in said meter island for detecting an arc based on measured value signals and said threshold values, and for producing a blocking signal based on at least one said arc, and a connecting line connecting said meter island to said medium frequency generator for blocking said generator for a predetermined time when said blocking signal is received.

2. Apparatus as in claim 1 further comprising a capacitor between said cathodes, a compensation winding in said current converter, said compensation winding being connected between said pair of conductors, and a capacitor between said compensation winding and said conductor into which said converter is not looped.

3. Apparatus as in claim 1 wherein said feedback network and said connecting line consist of light pipes.

4. Apparatus as in claim 3 further comprising an isolation transformer which supplies voltage to said meter island.

5. Apparatus as in claim 1 wherein said meter island comprises a trigger which receives said voltage and current values as analog inputs, and generates processed signals, an analog to digital converter which converts some of said processed signals to digital signals, an arc logic circuit which also receives some of said processed signals, a synchronization and timing unit which synchronizes said analog to digital converter to said arc logic circuit, and a microprocessor which communicates with said analog to digital converter, said arc logic circuit, and said synchronization and timing unit, said microprocessor forming said measured value signals and transmitting said measured value signals to said programmable storage controller.

6. Apparatus as in claim 5 wherein, said trigger comprises input amplifiers which receives said analog inputs and produces analog outputs, and quantifiers which receive said analog outputs from respective said input amplifiers to produce quantified values for voltage and current, said quantified values being used as threshold values.

7. Apparatus as in claim 1 wherein said means for detecting an arc determines that an arc is present when the voltage value is below a threshold voltage value and the current value is above a threshold current value.

8. Apparatus as in claim 1 wherein said means for producing a blocking signal only produces a blocking signal when the number of detected arcs exceeds a preset value.

* * * * *